United States Patent [19]
Colton

[11] Patent Number: 4,800,840
[45] Date of Patent: Jan. 31, 1989

[54] METHOD AND APPARATUS FOR VAPOR STREAM DISCRIMINATION

[75] Inventor: Russell F. Colton, Cedar Rapids, Iowa

[73] Assignee: Rockwell International Corporation, El Segundo, Calif.

[21] Appl. No.: 911,921

[22] Filed: Sep. 24, 1986

[51] Int. Cl.$^4$ .......................................... C23C 16/00
[52] U.S. Cl. .................................. 118/721; 118/720; 118/715; 118/504
[58] Field of Search ................ 118/720, 721, 504, 33, 118/715

[56] References Cited

U.S. PATENT DOCUMENTS

| | | | |
|---|---|---|---|
| 3,013,182 | 12/1961 | Russell . | |
| 3,241,519 | 3/1966 | Lloyd | 118/720 |
| 3,689,910 | 9/1972 | Glaser | 340/324 R |
| 4,121,129 | 10/1978 | Maloney | 313/221 |
| 4,389,176 | 6/1983 | deVries | 156/630 |
| 4,437,037 | 3/1984 | Harvey | 313/585 |
| 4,469,984 | 9/1984 | Serger | 313/348 |
| 4,514,658 | 4/1985 | Bloom | 313/402 |
| 4,518,894 | 5/1985 | Andreadakis | 313/491 |
| 4,565,755 | 1/1986 | Ohtake | 430/5 |
| 4,577,133 | 3/1986 | Wilson | 313/103 CM |
| 4,639,377 | 1/1987 | Yamamoto | 118/720 |
| 4,676,194 | 6/1987 | Saton | 118/720 |

FOREIGN PATENT DOCUMENTS

| | | | |
|---|---|---|---|
| 7302115 | 1/1973 | Japan | 118/720 |
| 7302114 | 1/1973 | Japan | 118/720 |

OTHER PUBLICATIONS

L. E. Tannas Jr., "Flat Panel Displays and CRTs", 1985, pp. 263, 264, 287.

*Primary Examiner*—Shrive Beck
*Assistant Examiner*—Vi Duong Dang
*Attorney, Agent, or Firm*—Gregory G. Williams; John C. McFarren; H. Fredrick Hamann

[57] ABSTRACT

Disclosed are a method and a matrix panel masking apparatus for forming very closely spaced, parallel, elongated, narrow, and electrically separate conductors on a dielectric surface. The matrix panel masking apparatus comprises a plurality of elongated taut wires, being arrangable in a configuration so that the interstices between the wires correspond to the desired matrix panel conductor pattern. The method includes: superposing the matrix panel masking apparatus of this invention on the dielectric surface, depositing conductive material through the interstices and on the dielectric so that after the masking apparatus is removed, the conductors will remain.

3 Claims, 2 Drawing Sheets

METHOD AND APPARATUS FOR VAPOR STREAM DISCRIMINATION

BACKGROUND OF THE INVENTION

1. Field of the Invention:

The present invention generally relates to matrix panels and their manufacture, and, more particularly, is concerned with the apparatus and method for manufacturing thin film electroluminescent (TFEL) panels.

2. Description of the Related Art:

In recent years, there has been a substantial demand to visually display information. Computers, data analyzers, plotters, radar apparatus, and avionics equipment are only a few of the many electronic devices which involve the visual display of information. Many types of electronic components have been utilized to accomplish visual display of information. One type has been thin film electroluminescent matrix displays (TFEL).

Such display panels comprise generally a transparent panel surface upon which is situated several very closely spaced, parallel, elongated, narrow, and electrically separate transparent conductors. A thin film transparent dielectric is then deposited over the conductor pattern. Upon this surface is deposited a phosphor substance which will emit visible light when subjected to the proper electric potential. Covering these phosphors is yet another thin film of transparent dielectric. Upon this upper dielectric surface, a series of very closely spaced, parallel, elongated, narrow, and electrically separate similar conductors are situated. The longitudinal axis of this upper set of conductors is typically perpendicular to the longitudinal axis of the lower set of conductors. This configuration forms essentially a tight mesh pattern of conductors separated by voltage sensitive phosphors. When the appropriate voltage is applied between a particularly selected pair of conductors, one from the upper conductor pattern and one from the lower conductor pattern, the intermediate phosphors will radiate and the visual display is accomplished within the area intersected by the two conductors.

The physical dimensions of a TFEL matrix display are variable, but typically the transverse dimension of and the perpendicular distance between the parallel conductors is several orders of magnitude smaller than the longitudinal dimension of the conductors There have been several methods used to construct such a pattern of very closely spaced, parallel, elongated, narrow, and electrically separate conductors, but the predominant method has been to deposit a thin film of conductive material upon the desired surface, which then is covered by a thin film of photoresist material. This photoresist is then subjected to a masked light source so that the incident light pattern corresponds to the desired conductor pattern. Typically, one of several etching processes are performed with the end result being a series of elongated electrically separate and parallel conductors being formed upon the surface. This thin film conductor deposition with its photoresist exposure and etching process is commonly used for matrix panel manufacture along with many other applications.

While this process, or variations of it, have been used extensively for matrix panel manufacture, it does have serious drawbacks. One major drawback is the amount of time required to make the several thin film depositions, the light exposure and the several etching operations. Thus, the conventional method requires a substantial expenditure of labor and the use of costly equipment. Another drawback is the tendency for the several etching operations to have a deleterious effect upon the dielectrics and the phosphors within the display panel. Immersing the panel in an etching solution to remove the photoresist and the appropriate portions of the thin conductor film can affect the dielectric materials and the phosphors located within the panel itself.

During the protracted experimentation leading up to the discovery of this invention, one alternative to this invention and the conventional method was attempted but found to be largely unsatisfactory. The attempt was to create a mask, used to facilitate the selective and patterned deposition of the conductor film. The mask was prepared by using the well-known and oft-used photoresist exposure and etching processes to etch interstices in a thin metal sheet. This type of etched thin metal sheet mask has been found to be largely unsatisfactory when the interstices are relatively long in comparison with the width of the remaining thin metal strips separating them. Such masks lack the requisite rigidity and durability needed in the elongated members separating the interstices. Another drawback of such masks is that they are relatively difficult, expensive and time consuming to manufacture.

Another device for manufacturing matrix panels has been disclosed in the reference text by L. E. Tannas Jr. entitled *Flat Panel Displays and CRTs,* published in 1985 by Van Nostrand Reinhold Company, New York, N.Y., which text is incorporated by reference and made an integral part of this application. Section 8.4.10 of that text, entitled "Electrode Definition", page 263-4, teaches the use of a Kovar mask in the electrode deposition process. The Kovar mask disclosed and shown in FIG. 8.31 on page 264 includes bridges over the interstices of the mask. These bridges tend to create a shadow which may result in non-uniform material deposition along the length of the conductor.

Consequently, a need exists for improvements in the process of and apparatus for depositing several parallel and elongated conductors for a matrix panel which will result in increased levels of conductor uniformity, device reliability and simplicity of manufacture, while concurrently resulting in reduced levels of capital investment, time and energy consumption and degradation of the phosphors and dielectrics.

It is therefore an object of the present invention to provide a matrix panel manufacture method which is quicker, cheaper, easier and more reliable than the conventional method.

It is further an object of this invention to provide a matrix panel manufacture method which produces more reliable matrix panels.

It is further an object of this invention to provide an apparatus used for patterned conductor depositions which is more rigid and durable than masks made by the etching process.

It is further an object of this invention to provide an apparatus which eliminates any bridges across the interstices and thereby provides for a more uniform deposition of the material along the length of the conductor.

It is further an object of this invention to provide an apparatus which is cheaper, quicker and easier to manufacture than those manufactured with the photoresist and etching methods.

SUMMARY OF THE INVENTION

The present invention provides a method and apparatus for forming conductors on matrix panels designed to satisfy the aforementioned needs. A matrix panel manufacture is carried out by a "photoresist-less and etching-less" process in the sense that no photoresist deposition with its concomitant etching operations are utilized over the active display area. Since the photoresist-less method does not require the panel itself to be immersed in an etching solution, the problem of degradation of the dielectrics and phosphors of the panel is eliminated. Furthermore, the time, energy and labor required for matrix panel manufacture is substantially reduced by this invention.

Accordingly, the present invention relates to an apparatus and method for forming elongated matrix panel conductors without the use of photoresist or etching operations. The apparatus of this invention includes a set of at least two parallel, coplanar and elongated wires.

The method of this invention includes the operative steps of: juxtaposing the apparatus of this invention with the surface for receiving the conductors, depositing the desired material upon the apparatus and through the interstices in the apparatus, and thereby upon the surface, and removing the apparatus.

These and other objects, advantages, novel features, and non-obvious improvements will become apparent from the following detailed description when considered with the accompanying drawings wherein:

DETAILED DESCRIPTION OF A PREFERRED EMBODIMENT

Figure 1:
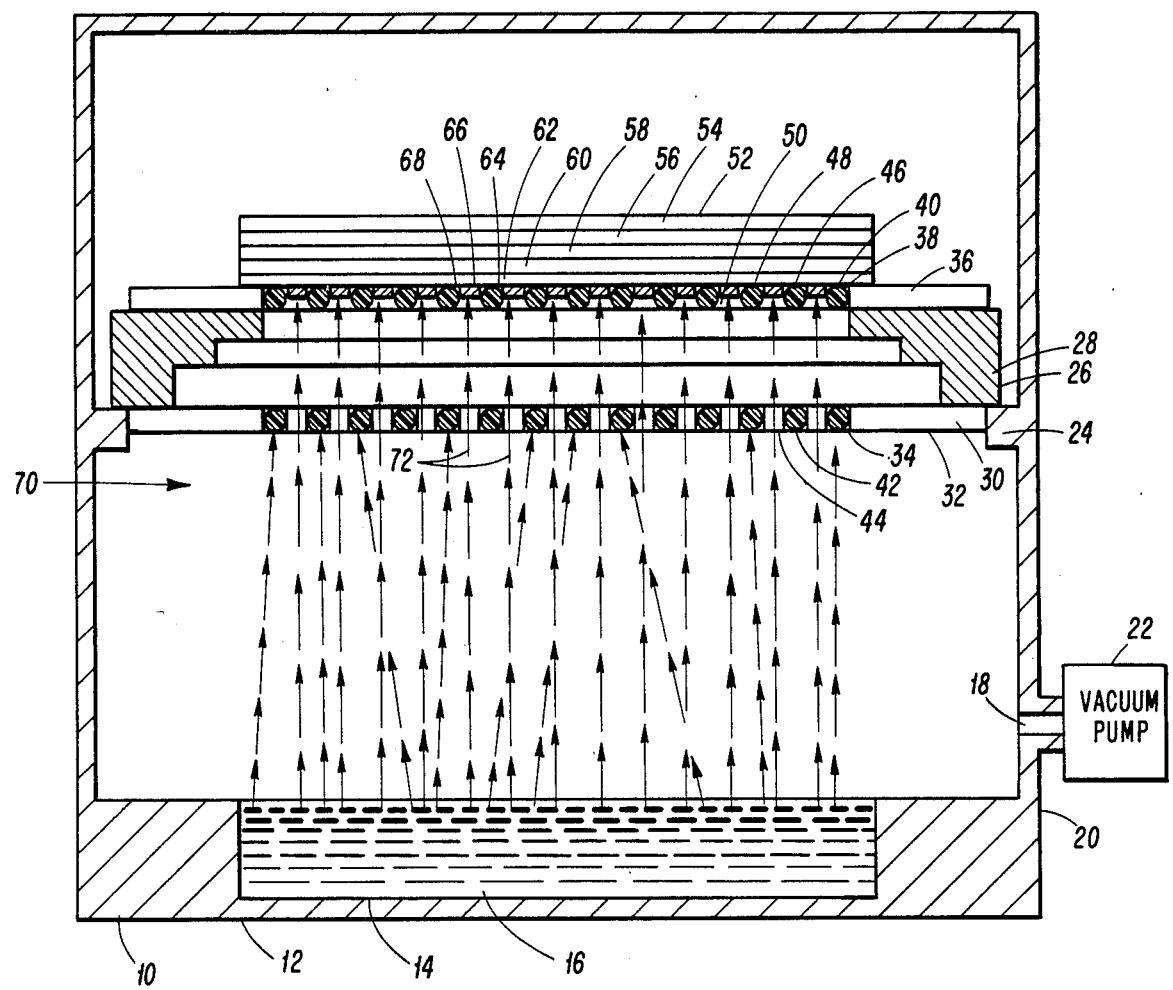
FIG. 1 is a schematic cross-section of a vapor deposition chamber and a cross-sectional view of the vapor stream discriminator of the present invention.

Referring now to the drawings, and more particularly to FIG. 1, there is shown a vapor deposition chamber 10 which is shown rectangular in shape but which may be of any suitable design or configuration. The vapor deposition chamber 10 at its bottom edge 12 has a thermal pot 14 for receiving conductive material 16. Thermal pot 14 is typically operated by using electrical current to heat the conductive material 16, but any means for heating the material 16 may be substituted. The vapor deposition chamber may be a vacuum chamber or at least partially evacuated by using an evacuation port 18 in an exterior wall 20 of the vapor deposition chamber 10 along with a vacuum pump 22 or the like. The vapor deposition chamber 10 also is shown having a holder 24 or the like Preferably, the holder 24 is a ring, clamp or other protuberance that provides a surface or restraint for supporting a vapor stream discriminator 26. Many vapor deposition chambers are known in the art in different forms and the above description is merely illustrative.

The vapor stream discriminator 26 is displayed in a cross-sectional view in FIG. 1, which shows a frame 28, composed of a material which is capable of remaining rigid at relatively high temperatures and also having a relatively low thermal coefficient of linear expansion; aluminum is preferred but any material having similar or superior properties may be alternatively utilized. The upper stream discriminator further includes a first end plate 30 of similar composition, which has a first end bottom edge 32 having a plurality of first end bottom notches 34 therein The first end bottom notches 34 are preferably rectangular in shape and can be formed on the first end plate 30 by machining, etching or any suitable method depending on the size and separation of the notches needed. The first end plate 30 also is shown having a first end top edge 36 which has a plurality of first end top notches 38 therein; these first end top notches 38 may be formed in a manner similar to the first end bottom notches 34 as described earlier. These notches 38 are for receiving wires 40. The wires 40 are preferably square in cross-section, but any shape of wire may be utilized The wires 40 may be made of metal, fabric, plastic or any suitable material In one particular preferred embodiment the wires 40 are one elongated monofilament line or the like which is wound around the first end and the second end.

The first end bottom notches 34 and the first end top notches 38 are preferably arranged so that each first end bottom notch 34 is in vertical alignment with a first end top notch 38. The vertical distance 90 between the first end bottom notches 34 and the first end top notches 38 is preferably equal to the vertical distance 92 between the second end bottom notches 78 and the second end top notches 82, these vertical distances 90 and 92 are variable and are a function of the flexibility of the wires 40 and the desired degree of vapor stream discrimination. For a typical TFEL panel and a vapor stream discriminator using monofilament line, the vertical distances 90 and 92 are preferably approximate ⅛ inch. The wires 40 between the first end bottom notches 34 and the second end bottom notches 78 (FIG. 2) essentially form a plurality 42 of parallel coplanar bottom wires in a bottom plane 44. Likewise, the wires 40 between the first end top notches 38 and the second end top notches 82 (FIG. 2) form essentially a plurality 46 of parallel co-planar wires in a top plane 48. These wires 40 with their interstices 50 therebetween serve to discriminate any vapor which rises from the thermal pot 14 through the bottom wires 42 and the top wires 46 before the vapor meets the matrix panel 52.

The matrix panel 52, schematically shown having typically arranged in a series of stacked layers a transparent surface 54, a layer of closely spaced, elongate, transparent conductors 56, a first dielectric layer 58, a phosphor layer 60, and a second dielectric layer 62, having a receiving surface 64 upon which is vapor-deposited a pattern of conductors 66. The conductors 66 are preferably deposited in an approximately rectangular shape. The shadow area 68 between the back side of the wires 40, in the top plurality 46 of wires, and the receiving surface 64 is ideally not subjected to vapor deposition, hence enhancing the approximate rectangular shape of the conductor 66. The shadow area has reduced exposure to the vapor molecules 70. A plurality of bottom wires 42 tends to block or restrict the passage to the receiving surface 64 and the shadow surface 68 of most of the vapor molecules 70 except for those molecules 72 which are traveling roughly perpendicular to the receiving surface 64.

The conductor 66 dimensions and spacing are variable as needed for each particular matrix panel requirement. Typically, the conductor 66 width is in the range of 0.008 inch to 0.016 inch, and the spacing range is 0.006 inch to 0.012 inch. Consequently, the wires 40 have a width corresponding to the conductor separation distance while the interstices 50 correspond to the conductor width.

Figure 2:
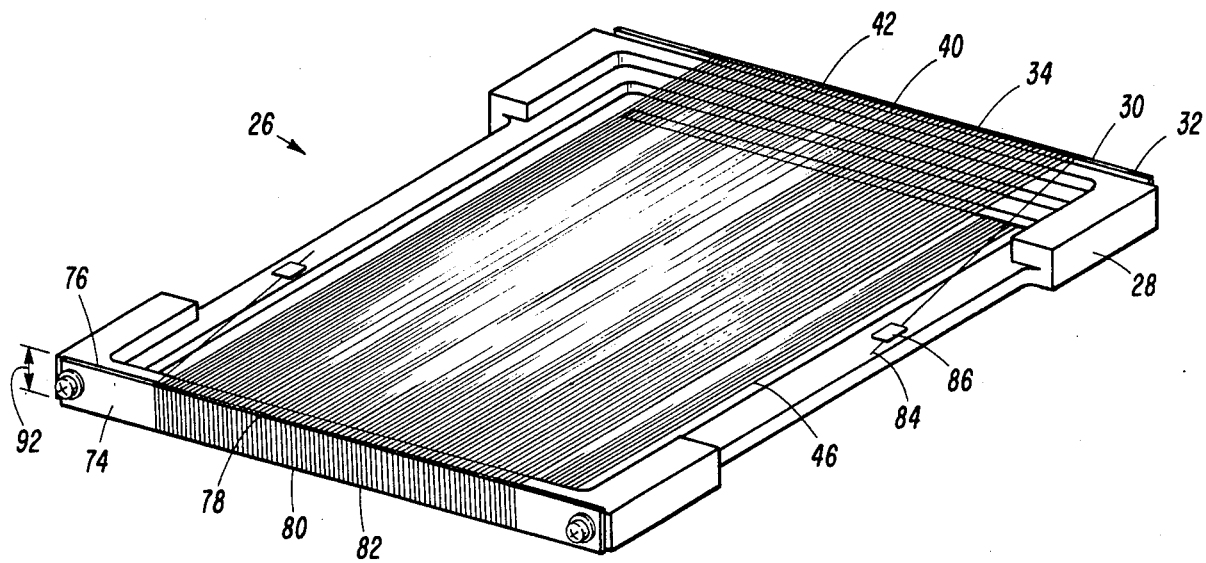
FIG. 2 is an isometric view of a preferred embodiment of the vapor stream discriminator of FIG. 1.

Now referring to FIG. 2, which shows the vapor stream discriminator 26 having the frame 28, which is shown in a roughly rectangular shape but any shaped frame that is suitable for a particular matrix panel, pattern of conductors or vapor deposition chamber may also be used. Also shown is a first end plate 30 having a first end bottom edge 32 and a plurality of first end bottom notches 34 thereon, which are shown receiving the wires 40 and more particularly a plurality of top wires 46. Shown also is the second end plate 74 attached to the frame 28 which has a second end bottom edge 76 having a plurality of second end bottom notches 78 thereon and a second end top edge 80 having a plurality of second end top notches 82 thereon.

In the preferred embodiment of the vapor stream discriminator 26, a single monofilament line 84 is attached to the frame 28 by a starting line connector 86, preferably an adhesive strip or the like. It is then successively wound through the first end bottom notches 34, across the first end plate 30, through the first end top notches 38, around the frame 28, through the second end top notches 82, across the second end plate 74, through the second end bottom notches 78, until the line 84 is attached to the frame 28 with an ending line connector, preferably an adhesive strip or the like.

Figure 3:
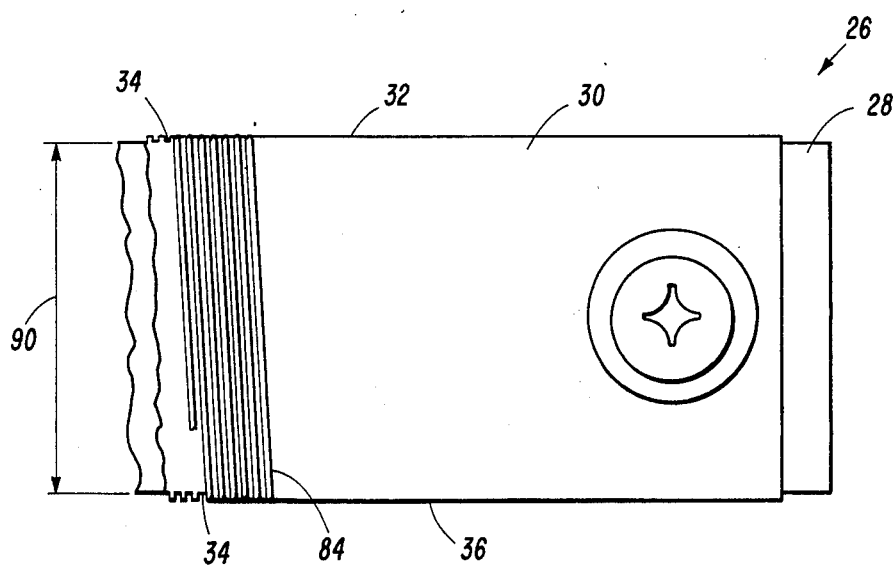
FIG. 3 is an enlarged partial end elevational view of one corner of the vapor stream discriminator apparatus shown in FIG. 2.

Now referring to FIG. 3, which shows in greater detail the vapor stream discriminator 26, the frame 28, the first end plate 30, first bottom edge 32, first end bottom notches 34, the first end top edge 36, first end top notches 38, and the line 84.

In operation, and now referring to FIG. 1, the several very closely spaced, parallel, elongated, narrow and electrically separate conductors 66 are made to form on the matrix panel 52 as follows: conductive material 16, usually a metal, is placed in the thermal pot 14. The vapor stream discriminator 26 is juxtaposed with the matrix panel 52 and the combination is placed in the holder 24 in the vapor deposition chamber 10, which is then evacuated. Conductive material 16 is then melted and further heated so that evaporation takes place. When individual molecules 70 within the molten metal acquire sufficient thermal energy to overcome the attraction of the surface molecules, they will escape through the surface (evaporate). These molecules 70 will travel in essentially straight paths until they collide with an object placed in their path, or until they collide with another molecule. The matrix panel 52 and vapor stream discriminator 26 combination is situated so that the bottom plurality of wires 42 and the top plurality of wires 46 are between the matrix panel 52 and the thermal pot 14. The two pluralities of wires tend to act as a vapor stream discriminator. The apparatus discriminates all of the molecules 70 except those molecules 72 moving roughly perpendicular to the receiving surface 64, which then are occluded from striking the matrix panel 52 and forming the conductors 66. This discrimination of all but the most perpendicularly-traveling molecules 72 tends to enhance the rectangular nature of the conductors 66.

It is believed that the apparatus and method of the present invention and many of its attendant advantages will be understood from the foregoing description, and it will be apparent that various changes may be made in the form, construction, and arrangement of the parts thereof without departing from the spirit and scope of the invention or sacrificing all of its material advantages, the form hereinbefore described being merely a preferred or exemplary embodiment thereof. It is the intention of the following claims to encompass and include all of such changes.

I claim:

1. An apparatus for vapor deposition masking to form elongated parallel conductors on a panel, comprising:
    a rigid frame having first and second ends and an open top and bottom;
    a first plurality of parallel, coplanar top wires mounted on said ends and spanning the top of said frame;
    a second plurality of parallel, coplanar bottom wires mounted on said ends and spanning the bottom of said frame; and
    each of said bottom wires vertically aligned with a corresponding one of said top wires so that said top and bottom wires form a vapor stream discriminator when the apparatus is placed in a vapor deposition chamber between a vapor source and the panel, said discriminator allowing only the vapor traveling most perpendicularly to the planes of said top and bottom wires to pass both said top and bottom wires and contact the panel.

2. The apparatus of claim 1, further comprising:
    a plurality of top notches along the tops of said first and second ends for positioning and securing said plurality of top wires;
    a plurality of bottom notches along the bottoms of said first and second ends for positioning and securing said plurality of bottom wires; and
    each of said bottom notches vertically aligned with a corresponding one of said top notches.

3. An apparatus for vapor deposition masking to form elongated parallel conductors on a panel, comprising:
    a rigid frame having first and second ends and an open top and bottom;
    a plurality of top notches along the tops of said first and second ends;
    a plurality of bottom notches along the bottoms of said first and second ends;
    each of said bottom notches vertically aligned with a corresponding one of said plurality of top notches;
    a wire wrapped around the top and bottom of said frame, through said notches, and around said first and second ends;
    said wrapped wire positioned in said notches so that each segment of wire across the bottom of said frame is aligned vertically with a corresponding segment of wire across the top of said frame; and
    said wire wrapped frame forming a vapor stream discriminator when placed in a vapor deposition chamber between a vapor source and the panel, said discriminator allowing only the vapor traveling most perpendicularly to the planes of said top and bottom wires to pass both said top and bottom wires and contact the panel.

* * * * *